United States Patent
Cheng et al.

(10) Patent No.: US 11,295,984 B2
(45) Date of Patent: Apr. 5, 2022

(54) METHOD FOR FORMING GATE OXIDE

(71) Applicant: SHANGHAI HUALI INTEGRATED CIRCUIT CORPORATION, Shanghai (CN)

(72) Inventors: Xinhua Cheng, Shanghai (CN); Jun Yin, Shanghai (CN)

(73) Assignee: SHANGHAI HUALI INTEGRATED CIRCUIT CORPORATION, Shanghai (CN)

(*) Notice: Subject to any disclaimer, the term of this patent is extended or adjusted under 35 U.S.C. 154(b) by 0 days.

(21) Appl. No.: 17/148,343

(22) Filed: Jan. 13, 2021

(65) Prior Publication Data

US 2022/0044972 A1 Feb. 10, 2022

(30) Foreign Application Priority Data

Aug. 6, 2020 (CN) .......................... 202010780587.8

(51) Int. Cl.
| | |
|---|---|
| *H01L 21/8234* | (2006.01) |
| *H01L 29/66* | (2006.01) |
| *H01L 21/28* | (2006.01) |
| *H01L 21/265* | (2006.01) |

(52) U.S. Cl.
CPC ........ *H01L 21/823462* (2013.01); *H01L 21/26586* (2013.01); *H01L 21/2822* (2013.01); *H01L 21/28185* (2013.01); *H01L 29/66734* (2013.01)

(58) Field of Classification Search
CPC ....... H01L 21/823462; H01L 21/26586; H01L 21/28185; H01L 21/823857; H01L 21/2522; H01L 21/76237; H01L 21/76235; H01L 21/76232; H01L 29/51
See application file for complete search history.

(56) References Cited

U.S. PATENT DOCUMENTS

| | | | | |
|---|---|---|---|---|
| 6,063,694 A | * | 5/2000 | Togo ................. | H01L 21/76232 438/440 |
| 2006/0079068 A1 | * | 4/2006 | Sheu ...................... | H01L 28/40 438/433 |
| 2010/0052019 A1 | * | 3/2010 | Yamamoto ........ | H01L 29/42368 257/288 |
| 2012/0168895 A1 | * | 7/2012 | Yin .................. | H01L 21/76232 257/506 |

* cited by examiner

*Primary Examiner* — Joseph C. Nicely
(74) *Attorney, Agent, or Firm* — Alston & Bird LLP

(57) ABSTRACT

A method for forming a gate oxide film of a transistor device includes: step 1: forming a hard mask layer on the surface of a semiconductor substrate, etching the hard mask layer and the semiconductor substrate to form shallow trenches; step 2: performing an tilt-angle ion implantation to the upper area of the side surfaces of each shallow trench to form an upper doped region; step 3: filling a field oxide layer into the shallow trenches and removing the hard mask layer; and step 4: performing thermal oxidation to form a gate oxide film on the surface of an active region. The method can improve the morphology of the gate oxide film, thus increase the breakdown voltage threshold and reliability of the device.

15 Claims, 6 Drawing Sheets

METHOD FOR FORMING GATE OXIDE

CROSS-REFERENCES TO RELATED APPLICATIONS

This application claims priority to Chinese patent application No. CN201010780587.8 filed on Aug. 6, 2020, and entitled "METHOD FOR FORMING GATE OXIDE", the disclosure of which is incorporated herein by reference in entirety.

TECHNICAL FIELD

The disclosure relates to a method for making semiconductor integrated circuit, and in particular, to a method for forming a gate oxide film in a transistor device.

BACKGROUND

In semiconductor integrated circuits, all semiconductor devices, such as the Complementary Metal-Oxide-Semiconductor (CMOS), the Vertical Diffusion Metal-Oxide Semiconductor (VDMOS) and the Insulated-Gate Bipolar Transistor (IGBT), includes a gate oxide film layer at the transistor gate. A gate of a semiconductor transistor such as the polysilicon gate is formed on top of the gate oxide film. Generally speaking, a transistor is built in a body of doped semiconductor, the source and drain regions of the transistor are disposed in heavily doped wells at two sides of the polysilicon gate, and a channel region is formed under the polysilicon gate separated by the gate oxide film. When an "on" gate voltage is applied to the polysilicon gate, the polysilicon gate inverses the surface charge barrier of the channel region and makes channel conductive, thus a channel current forms from the charge carriers flow. The gate oxide film is an insulating layer between the polysilicon gate and the channel region to prevent from generating a leakage current between the channel region and the polysilicon gate. If the quality of the gate oxide film is good, the leakage current is reduced and the device is more reliable.

However, in applying techniques to control voltage through the gate oxide film, there are often some factors such as charges or hot carriers in the gate oxide film, which lead to failures of certain electrical parameters in the testing process related to the gate oxide film. Such failures increase the leakage current, thus reduce the reliability. The charges or hot carriers that influence the electrical performance of the gate oxide film include charges captured by an interface state in the gate oxide film. The hot carriers are carriers on the surface of the channel region which are accelerated by an electric field when the device is turned on. Usually, when the voltage of a drain region is high, the channel region becomes depleted, and a larger electric field is formed. The larger electric field accelerates the carriers into hot carriers, which possess higher energy. The energetic hot carriers may enter the gate oxide film or even penetrate through the gate oxide film, causing poor electrical performance of the gate oxide film.

To prevent the effect of charges or hot carriers and improve the electrical parameters of the gate oxide film, it is necessary have two approaches. On one hand, by improving the quality of the gate oxide film to reduce the interface state and the captured charges, so as to increase the intrinsic breakdown voltage. On the other hand, improving the morphology of the gate oxide film has become more of a technology focus lately.

BRIEF SUMMARY

The disclosure provides a method for forming a gate oxide film for a transistor, the method improves the morphology of the gate oxide film and thus can improve the breakdown voltage and reliability of a device.

The method for forming the gate oxide film according to the disclosure includes a plurality of steps:

step 1: forming a hard mask layer on a surface of a semiconductor substrate, sequentially etching the hard mask layer and the semiconductor substrate in areas of shallow trenches, and forming an active region in the semiconductor substrate between two adjacent ones of the shallow trenches, and wherein portions of the hard mask layer remain on a surface of the active region;

step 2: performing an tilt-angle ion implantation into an upper area of side surfaces of each of the shallow trenches to form an upper doped region, wherein the upper doped region is located on an edge of an outer side of the active region;

step 3: filling a field oxide layer into the shallow trenches and removing the hard mask layer; and step 4: performing thermal oxidation to form the gate oxide film on the surface of the active region, wherein ions implanted into the upper doped region increase a thermal oxidation rate in the upper doped region, resulting a larger gate oxide film thickness on the surface of the upper doped region than a gate oxide film thickness on the surface of the active region, and wherein the gate oxide film in the upper doped region has a rounded morphology.

In some cases, the semiconductor substrate is a silicon substrate.

In some cases, the hard mask layer comprises a nitride layer and an oxide layer in a stacked manner.

In some cases, in step 2, an implantation energy of the tilt-angle ion implantation is set up below a maximum energy to ensure that the ions do not pass through the hard mask layer to reach the surface of the active region.

In some cases, the implantation energy of the tilt-angle ion implantation is in a range of 500 kev-5 kev.

In some cases, in step 2, a longitudinal depth of the upper doped region is determined by a thickness of the hard mask layer, a top opening width of each of the shallow trenches and an implantation angle of the tilt-angle ion implantation; wherein the thickness of the hard mask layer and the top opening width of each of the shallow trenches are fixed variables, wherein the implantation angle of the tilt-angle ion implantation is a variable, and wherein the longitudinal depth of the upper doped region is determined by setting the implantation angle of the tilt-angle ion implantation.

In some cases, in step 2, a total implantation dose of the tilt-angle ion implantation is reached in several times.

In some cases, in step 2, in the tilt-angle ion implantation, a normal of the semiconductor substrate rotates around an implantation direction of the tilt-angle ion implantation.

In some cases, in step 2, the ions in the tilt-angle ion implantation comprise argon ions or fluorine ions.

In some cases, in step 4, a temperature of the thermal oxidation for the gate oxide film is in the range of 800° C.-1100° C.

In some cases, in step 3, a filling process of the field oxide layer is a High Density Plasma Chemical Vapor Deposition (HDPCVD) process.

In some cases, after the filling process of the field oxide is completed, the method for forming the gate oxide film further comprises performing a back-etching or a chemical-mechanical polishing to the field oxide layer to achieve none of the field oxide layer left outside the shallow trenches.

In some cases, after step 4, the method for forming the gate oxide film further comprises steps of: forming a gate conducting material layer and patterning the gate conducting material layer in a forming area of gate structures, wherein the gate oxide film and the gate conducting material layer are stacked.

In some cases, the gate conducting material layer comprises polysilicon.

In some cases, semiconductor devices that include the gate oxide film comprise CMOS, VDMOS and IGBT.

Aiming at the technical problem to be solved by the disclosure, the semiconductor substrate is pretreated before the gate oxide is formed. Specifically, after the shallow trenches are formed and before the field oxide is filled into the shallow trenches, tilt angle ion implantation is added. The tilt angle ion implantation can implant the ions into the tops of the side surfaces of each shallow trench to form the top corner region, and the longitudinal depth of the top corner region can be adjusted. Because the active region is defined by the shallow trenches and the edge of the active region is just located in the top corner region, the ions implanted into the top corner region can increase the thermal oxidation speed in the thermal oxidation process for the gate oxide, thus thickness of the gate oxide on the surface of the top corner region can be increased and the gate oxide has a rounded morphology in the top corner region.

However, in the existing process, there is no ion implanted into the corresponding top corner region. In the thermal oxidation process for the gate oxide film, the thermal oxidation speed on the surface of the top corner region is slower than that on the surface of the internal area of the active region, and the difference is great. The surface of the internal area of the active region is the surface of the active region located on the inner side of the top corner region, which will cause a great difference between the thickness of the gate oxide film on the surface of the top corner region and the thickness of the gate oxide film on the surface of the internal area of the active region, such that the gate oxide film on the surface of the top corner region becomes the weak link of the gate oxide film on the surface of the whole active region, breakdown is easily caused at the gate oxide film on the surface of the top corner region and the reliability of the device is reduced.

By increasing the thickness of the gate oxide film on the surface of the top corner region, the difference between the thickness of the gate oxide film on the surface of the top corner region and the thickness of the gate oxide film on the surface of the internal area of the active region can be reduced, the gate oxide film in the top corner region can be more rounded, the voltage withstanding ability at the gate oxide film on the surface of the top corner region can be improved, the voltage withstanding ability of the gate oxide film on the surface of the whole active region can be improved finally, and thus the breakdown voltage and reliability of the device can be improved.

BRIEF DESCRIPTION OF THE DRAWINGS

The disclosure will be further described below in detail in combination with the specific embodiments with reference to the drawings.

DETAILED DESCRIPTION OF THE DISCLOSURE

Figure 1:
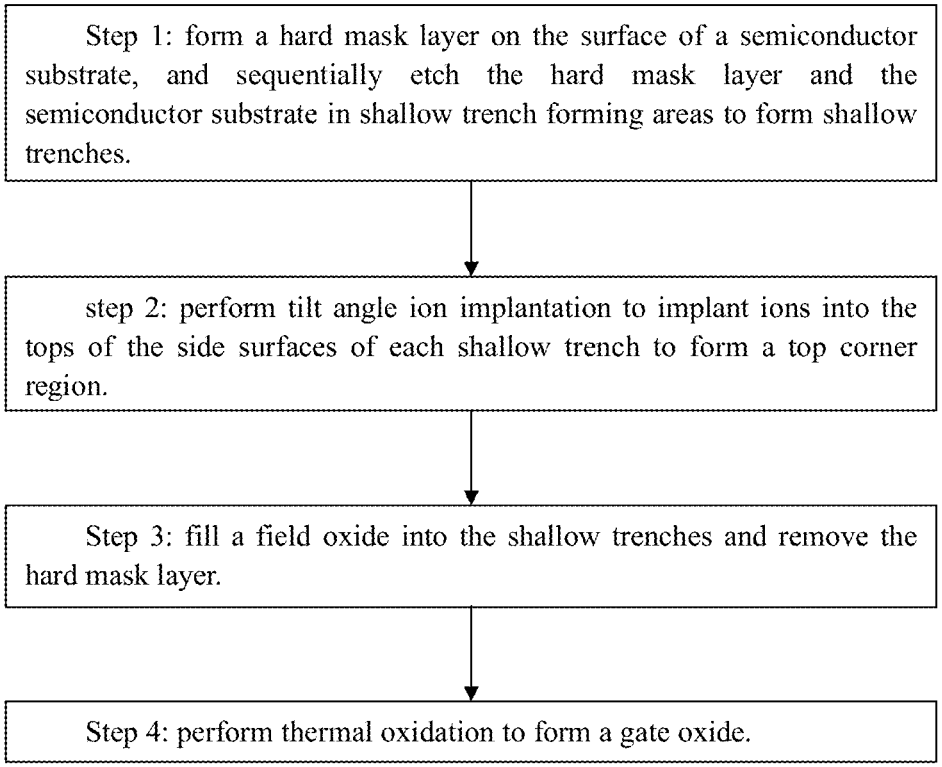
FIG. 1 is a flowchart of a method for forming a gate oxide film for the transistor according to one embodiment of the disclosure.
Figure 2A:
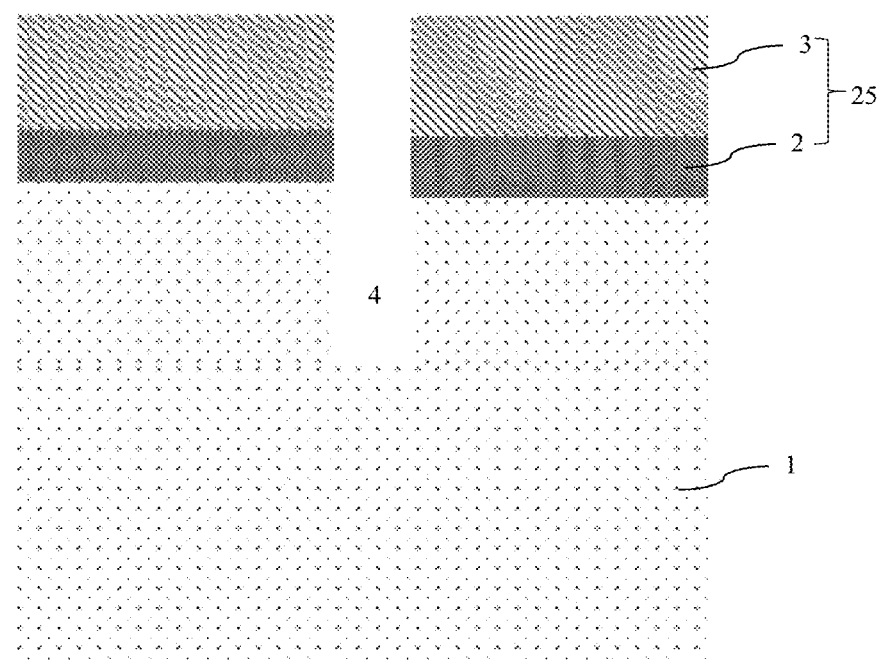
FIG. 2A to FIG. 2F are cross sectional views of the transistor structure after some major steps of the forming method according to one embodiment of the disclosure.

FIG. 1 a flowchart of a method for forming a gate oxide film for a transistor according to one embodiment of the disclosure. FIG. 2A to FIG. 2F are cross sectional views of the transistor structure after some major steps of the forming method according to one embodiment of the disclosure. The method for forming the gate oxide film according to the figures includes the following steps:

In step 1, referring to FIG. 2A, a hard mask layer 25 is formed on the surface of a semiconductor substrate 1.

In the method according to the embodiment of the disclosure, the semiconductor substrate 1 is a silicon substrate.

The hard mask layer 25 is formed by an oxide layer 2 and a nitride layer 3 in a stacked manner. In other embodiments, the hard mask layer 25 may consist of a nitride layer.

The hard mask layer 25 and the semiconductor substrate 1 are sequentially etched to form shallow trenches 4 through the hard mask 25 into the substrate 1. Regions located between two adjacent shallow trenches 4 in the semiconductor substrate form active areas for making the transistors. The hard mask layer 25 outside the shallow trenches on the surface of the active region remains intact.

In the method according to the embodiment of the disclosure, to pattern the shallow trenches 4 a photoresist first applied and exposed on the hard mask through a photolithography process, followed by etching the hard mask layer 25 and the semiconductor substrate 1, then the photoresist pattern is removed. In this patterning process, etching the semiconductor substrate 1 to form a straight profile for the shallow trenches is protected by using the hard mask layer 25 as a mask.

In step 2, performing a tilt-angle ion implantation into the upper side surfaces of each shallow trench 4 to form a top corner region 5. The upper corner region 5 is located on the upper edge of the outer surface of the active region.

According to one aspect of the embodiment, the maximum implantation energy of the tilt-angle ion implantation is limited to ensure that the implanted ions do not pass through the hard mask layer 25 and reach the surface of the active region at the bottom of the hard mask layer 25. The implantation energy of the tilt-angle ion implantation is in the range of 500 kev-5 kev.

The implanted ions in the tilt-angle ion implantation include argon, boron, oxygen, or fluorine ions.

The total implantation dose of the tilt-angle ion implantation is reached in multiple times. In the tilt-angle ion implantation, the normal axis of the semiconductor substrate 1 rotates around the implantation direction.

Figure 2B:
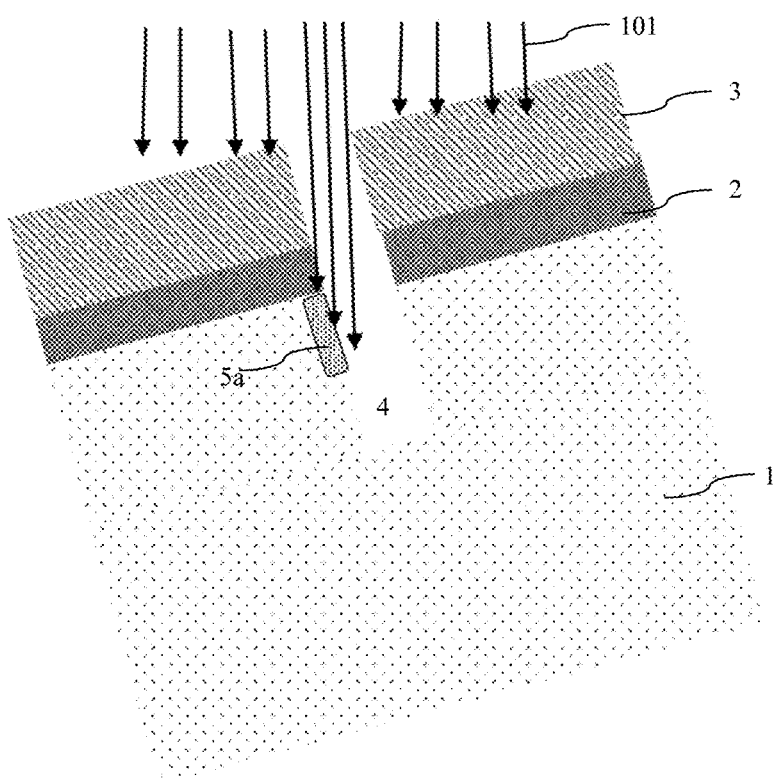

FIG. 2B is a view when the tilt-angle ion implantation is performed when the semiconductor substrate 1 is in one position. The arrow lines 101 represent the ion flow at the tilt-angle, and the implantation angle is an included angle between the implantation direction and the normal direction of the semiconductor substrate 1. In FIG. 2B, ions at one tilt-angle can only reach an upper area of one side surface in the shallow trench 4 The upper area formed after implantation at one tilt-angle is represented by 5a.

Figure 2C:
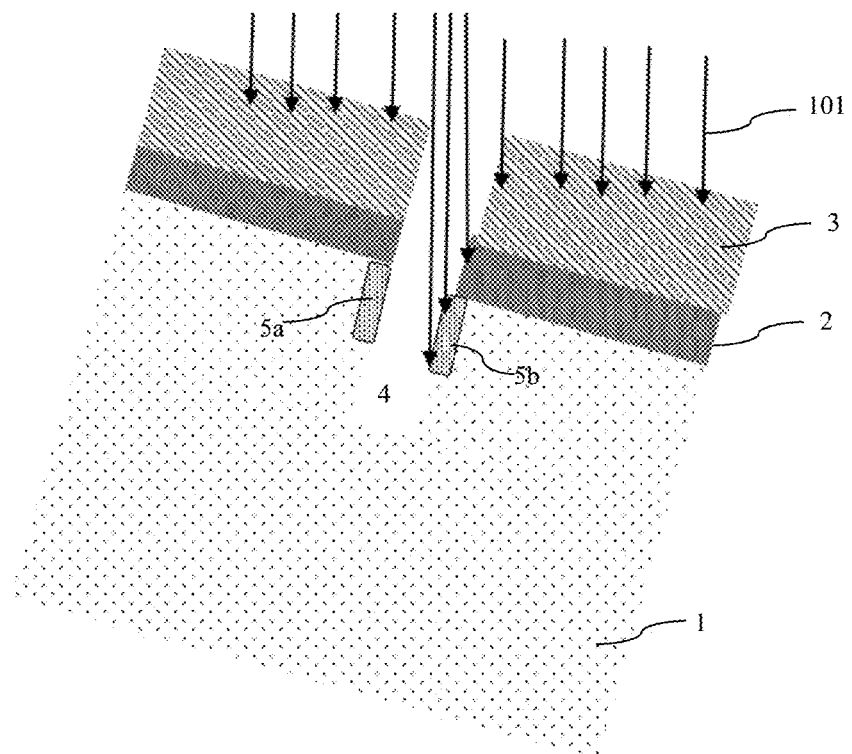

FIG. 2C shows a view how the tilt-angle ions flow when the semiconductor substrate 1 rotates to the opposite direction as in FIG. 2B. The tilt-angle ions reach into the upper area of the other side surface of the shallow trench 4, and the upper area formed after the implantation at this angle during the second time is represented by 5b.

Figure 2D:
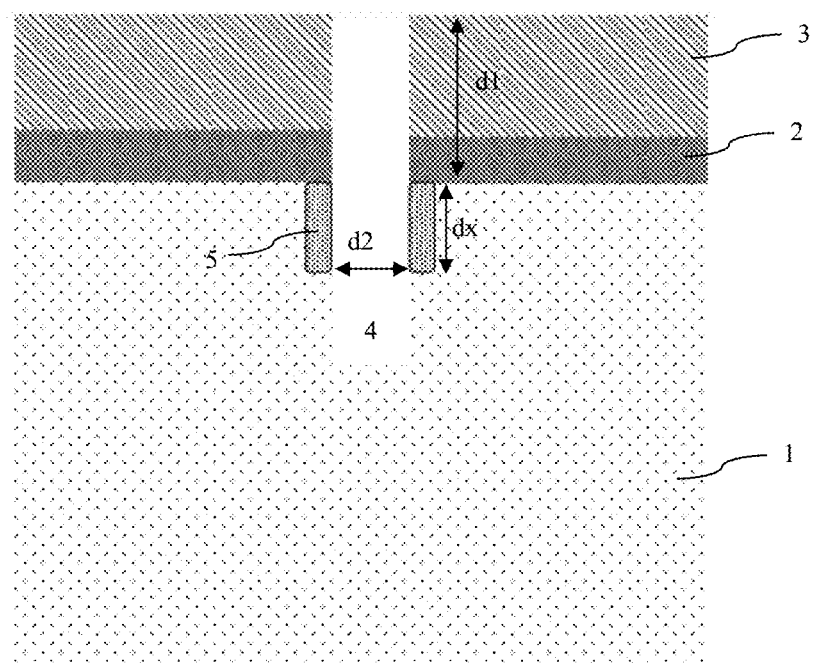

As the normal of the semiconductor substrate 1 rotates around the implantation direction of the tilt-angle ions and the implantation is performed in batch mode, the implanted dose density in the upper area 5 near the top of shallow trenches 4 are ensured to be uniform. As shown in FIG. 2D, upper areas of two opposite surfaces are doped at completion.

The longitudinal depth of the upper sides 5 is determined by the thickness of the hard mask layer 25, the upper opening width of the shallow trench 4, and the implantation tilt-angle. The thickness of the hard mask layer 25 and the upper opening width of the shallow trench 4 are process determined, the implantation tilt-angle is a variable, so the longitudinal depth of the upper doped area 5 is determined by setting the implantation tilt-angle. In FIG. 2D, d1 represents the thickness of the hard mask layer 2, d2 represents the width of the shallow trench 4 at the bottom of the upper doped area 5; if the side surface of the shallow trench 4 is vertical, d2 is equal to the top opening width of the shallow trench 4; if the side surface of the shallow trench 4 is inclined, d2 can also be obtained from the top opening width of the shallow trench 4, so generally d2 is approximately equal to the top opening width of the shallow trench 4; dx represents the depth of the upper doped region 5; a represents the tilt-angle of the ion implantation.

Figure 3:
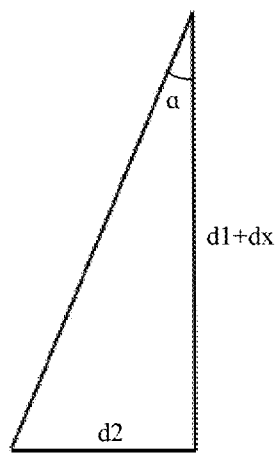
FIG. 3 is a schematic chart showing a relationship between longitudinal depth of a top corner region and the tilt implantation angle in step 2 of the forming method according to one embodiment of the disclosure.

Referring to FIG. 3, it is a schematic chart of a geometric relationship between the longitudinal depth of the upper doped area and the tilt-angle of the implantation in step 2 of this method according to this embodiment. The corresponding d1, d2, dx and α in FIG. 2D are also marked in FIG. 3. The hypotenuse of the triangle in FIG. 3 corresponds to the implantation direction of the tilt-angle ion implantation. From FIG. 3, the following can be obtained: $tg(\alpha)=d2/(d1+dx)$.

After transformation, the following can be obtained: $dx=(d2-d1*tg(\alpha))/tg(\alpha)$.

From the above formula, it can be seen that the specific values of d1 and d2 may be changed according to the actual process, but once variables d1 and d2 are fixed, for example, d1 may be taken as 600 Å, d2 may be taken as 50 Å, but they will not change in step 2. However, α may be adjusted in step 2, and dx is a variable of the adjustable α.

Figure 2E:
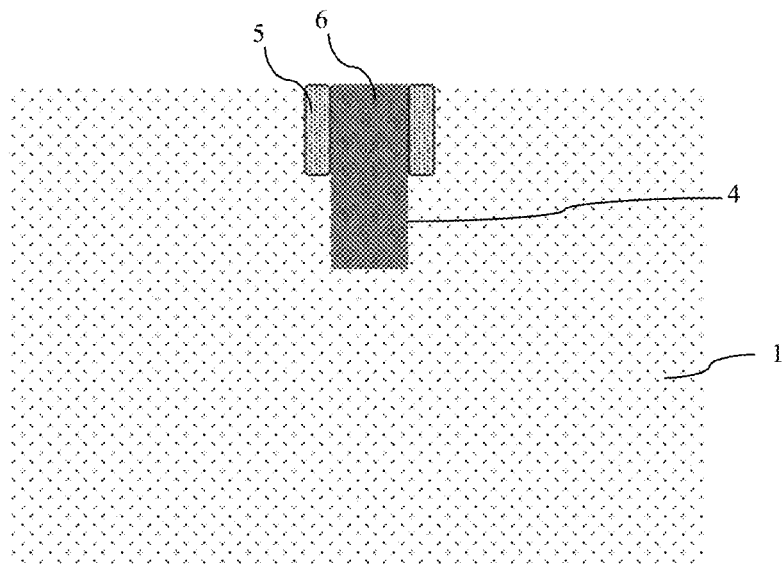

In step 3, referring to FIG. 2E, a field oxide layer 6 is filled into the shallow trenches 4 followed by removing the hard mask layer 25.

In the method according to the embodiment, the field oxide layer 6 is deposited with a High Density Plasma Chemical Vapor Deposition (HDPCVD) process.

After the field oxide layer 6 deposition process is completed, the method for forming the gate oxide film further includes performing back-etching or chemical-mechanical polishing on the field oxide layer 6 to fill it into the shallow trenches 4 only.

Figure 2F:
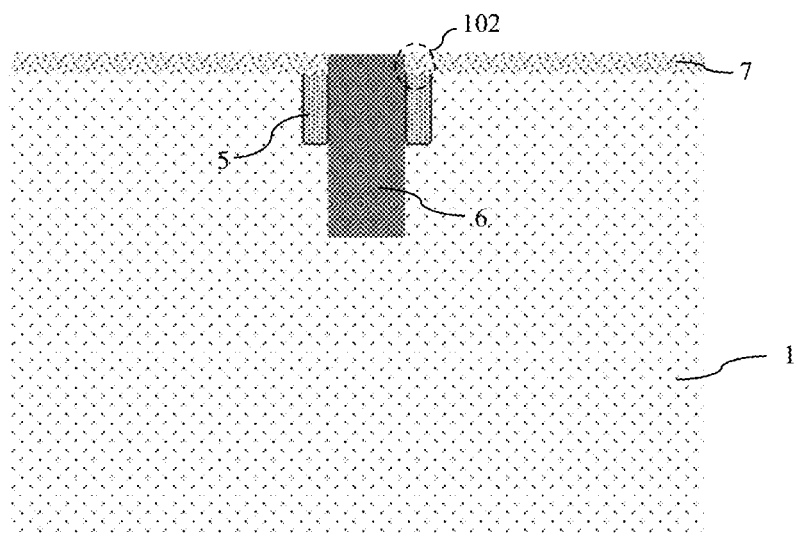

In step 4, referring to FIG. 2F, thermal oxidation is performed to form the gate oxide film 7 on the surface of the active region. In the thermal oxidation process to form the gate oxide film 7, the ions implanted in the upper area 5 accelerates the thermal oxidation, such that the thickness of the gate oxide film 7 on the surface of the upper doped area 5 is increased, so the gate oxide film 7 has a rounded morphology in the upper area 5. Compared with the device not applying the tilt-angle ion implantation, the structure in FIG. 2F has the increased field oxide thickness of the shown as in the dotted circle 102 where the morphology is more rounded.

According to the embodiment of the disclosure, the temperature of thermal oxidation for growing the gate oxide film 7 is in the range of 800° C.-1100° C.

To demonstrate the increased thickness of the gate oxide film 7 formed by applying the disclosed method to the surface of the upper area 5, description will be made with reference to the SEM image data from the gate oxide film 7.

Figure 4A:
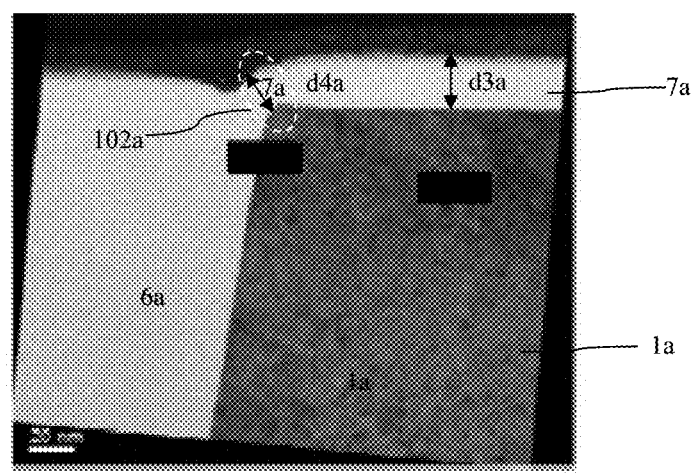
FIG. 4A is a SEM image of a gate oxide film formed with an existing method which does not apply the tilt-angle ion implantation.

FIG. 4A is a SEM image of a gate oxide film formed with an existing method which does not apply the tilt-angle ion implantation. In FIG. 4A, the semiconductor substrate is marked with reference number 1a, the field oxide film is marked with reference sign 6a separately, and the gate oxide film is marked with reference number 7a. The gate oxide film 7a on the surface of the upper corner is located in the dotted circle 102a. The thickness of the gate oxide film 7a on the surface of the upper corner is marked as d4a, and the thickness of the gate oxide film 7b on the surface of the active region on the inner side of the top corner region is marked by d3a; here d3a is 214.5 Å, d4a is 164.9 Å, and the ratio of d4a to d3a is 76.88%. The ratio of d4a to d3a represents the step coverage ability of the gate oxide film 7a formed by applying the existing method.

Figure 4B:
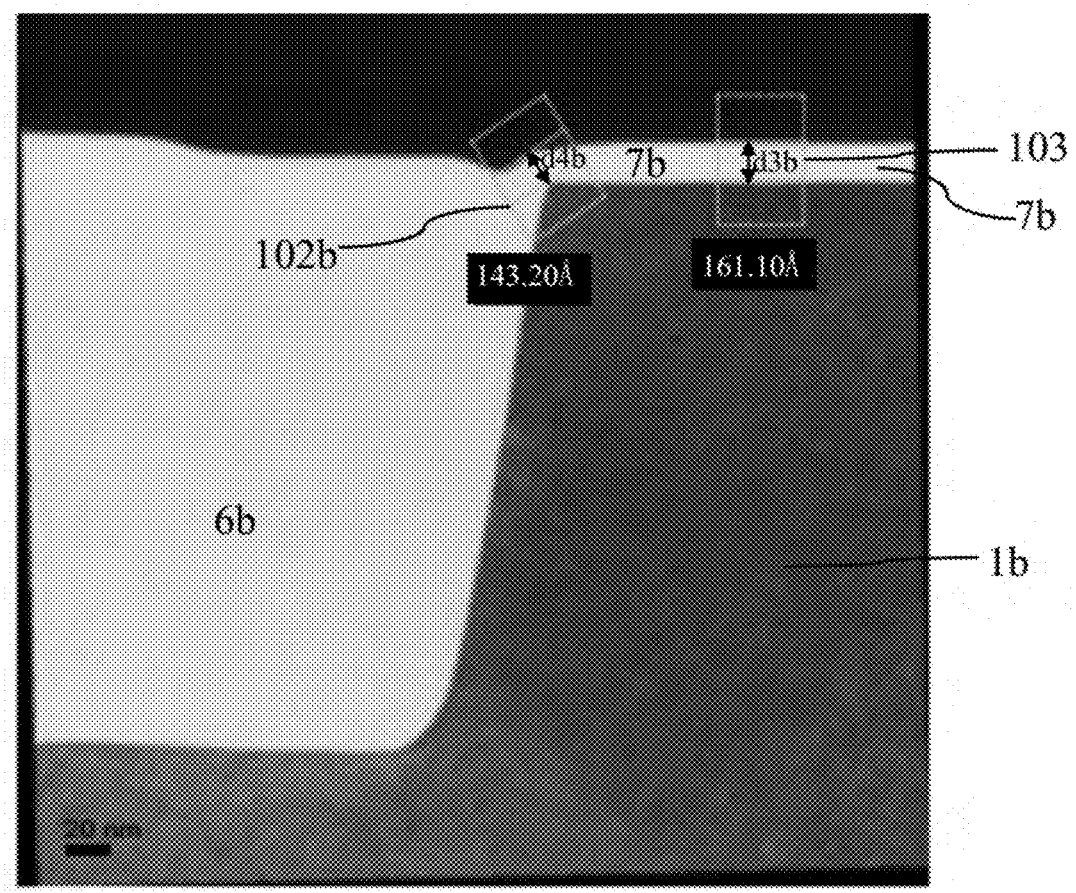
FIG. 4B is a SEM image of a gate oxide film formed according to one embodiment of the disclosure.

FIG. 4B is a SEM image of a gate oxide film formed according to the embodiment of the disclosure. In FIG. 4B, the semiconductor substrate is marked with reference number 1b, the field oxide layer is marked with reference 6b, and the gate oxide film is marked with reference 7b. The gate oxide film 7b on the surface of the top corner region is located in the box 102b, the thickness of the gate oxide film 7b on the surface of the top corner region is marked as d4b, the thickness of the gate oxide film 7b on the surface of the active region on the inner side of the top corner region is represented by d3b in the box103; d3b is 161.10 Å, d4b is 143.20 Å, and the ratio of d4b to d3b is 88.89%. The improved ratio of d4b to d3b in FIG. 4B versus FIG. 4A represents the step coverage ability of the gate oxide film 7b after applying the tilt-angle implantation method according to the embodiment of the disclosure. Thus the step coverage ability of the gate oxide film 7b formed by this method has been significantly increased, from 76.88% to 88.89%.

After step 4, the method for forming the gate oxide film further includes the following steps:

A gate conducting material layer is formed. Usually, the material of the gate conducting material layer includes polysilicon.

The gate conducting material layer is patterned, and the patterned gate conducting material layer is only located in a forming area of gate structures, the wherein the gate conducting material layer stacks on top of the gate oxide film 7.

All Semiconductor devices such as CMOS, VDMOS and IGBT include gate oxide films.

As described in the disclosure, the semiconductor substrate 1 is pretreated before the gate oxide film 7 is formed. Specifically, after the shallow trenches 4 are formed and before the field oxide layer 6 is filled in the shallow trenches 4, tilt-angle ion implantation is added. The tilt-angle ion implantation can dope ions into upper areas of the side surfaces of the shallow trenches 4 to form the upper corner doped areas 5, and the longitudinal depth of the upper corner doped areas 5 can be adjusted. Because the active region is defined by the shallow trenches 4 and the edge of the active region is just located in the upper corner doped areas 5, the ions implanted into the upper corner areas 5 can increase the thermal oxidation rate in the thermal oxidation process for the gate oxide film 7, thus the thickness of the gate oxide film 7 on the surface of the upper corner doped areas 5 is increased and the gate oxide film 7 shows a rounded morphology in the upper corner areas 5.

However, in the existing process, there is no ion implanted into the corresponding upper corner areas. In the thermal oxidation process for the gate oxide film, the thermal oxidation rate on the surface of the upper corner areas is slower than that on the surface of the internal area of the active region, and the difference is significant. The surface of the internal area of the active region is the surface of the active region located on the inner side of the upper corner area, which shows a large difference between the thickness of the gate oxide film on the surface of the upper corner doped areas and the thickness of the gate oxide film on the surface of the internal area of the active region, such that the gate oxide film on the surface of the upper corner areas becomes the weak link of the gate oxide film on the surface of the whole active region. As a result, breakdown easily occurs at the gate oxide film on the surface of the upper corner areas, reducing the device reliability.

By increasing the thickness of the gate oxide film 7 on the surface of the upper corner doped areas 5, the difference between the thickness of the gate oxide film 7 on the surface of the upper corner area 5 and the thickness of the gate oxide film 7 on the surface of the internal area of the active region can be reduced, the gate oxide film 7 in the upper corner doped area 5 grows more rounded, the voltage withstanding ability at the gate oxide film 7 on the surface of the upper corner area 5 can be improved, the voltage withstanding ability of the gate oxide film 7 on the surface of the whole active region can be improved finally, thus the breakdown voltage and reliability of the device can be improved.

The disclosure has been described above in detail through the specific embodiments. However, these specific embodiments do not form limitations to the disclosure. Those skilled in the art may make various variations and improvements without departing from the principle of the disclosure, which, however, shall also be regarded as included in the scope of protection of the disclosure.

What is claimed is:

1. A method for forming a gate oxide film for a transistor, comprising a plurality of steps:

step 1: forming a hard mask layer on a surface of a semiconductor substrate, sequentially etching the hard mask layer and the semiconductor substrate in forming areas of shallow trenches, and forming an active region in the semiconductor substrate between two adjacent ones of the shallow trenches, and wherein portions of the hard mask layer remain on a surface of the active region;

step 2: performing an tilt-angle ion implantation into an upper area of side surfaces of each of the shallow trenches to form an upper doped region, wherein the upper doped region is located on an edge of an outer side of the active region;

step 3: filling a field oxide layer into the shallow trenches and removing the hard mask layer; and step 4: performing thermal oxidation to form the gate oxide film on the surface of the active region, wherein ions implanted into the upper doped region increase a thermal oxidation rate in the upper doped region, resulting in a larger gate oxide film thickness on the surface of the upper doped region than a gate oxide film thickness on the surface of the active region, and wherein the gate oxide film in the upper doped region has a rounded morphology.

2. The method for forming the gate oxide film according to claim 1, wherein the semiconductor substrate is a silicon substrate.

3. The method for forming the gate oxide film according to claim 1, wherein the hard mask layer comprises a nitride layer and an oxide layer in a stacked manner.

4. The method for forming the gate oxide film according to claim 1, wherein in step 2, an implantation energy of the tilt-angle ion implantation is set up below a maximum energy to ensure that the ions do not pass through the hard mask layer to reach the surface of the active region.

5. The method for forming the gate oxide film according to claim 4, wherein the implantation energy of the tilt-angle ion implantation is in a range of 500 kev-5 kev.

6. The method for forming the gate oxide film according to claim 1, wherein in step 2, a longitudinal depth of the upper doped region is determined by a thickness of the hard mask layer, a top opening width of each of the shallow trenches and an implantation angle of the tilt-angle ion implantation; wherein the thickness of the hard mask layer and the top opening width of each of the shallow trenches are fixed variables, wherein the implantation angle of the tilt-angle ion implantation is a variable, and wherein the longitudinal depth of the upper doped region is determined by setting the implantation angle of the tilt-angle ion implantation.

7. The method for forming the gate oxide film according to claim 6, wherein in step 2, a normal axis of the semiconductor substrate rotates around an implantation direction, wherein a total implantation dose of the tilt-angle ion implantation is performed in multiple times in a batch mode, and wherein the total ion implantation dose is reached in several times.

8. The method for forming the gate oxide film according to claim 7, wherein in step 2, in the tilt-angle ion implantation, a normal of the semiconductor substrate rotates around an implantation direction of the tilt-angle ion implantation.

9. The method for forming the gate oxide film according to claim 7, wherein in step 2, the ions in the tilt-angle ion implantation comprise argon ions or fluorine ions.

10. The method for forming the gate oxide film according to claim 1, wherein in step 4, a temperature of the thermal oxidation for the gate oxide film is in the range of 800° C.-1100° C.

11. The method for forming the gate oxide film according to claim 1, wherein in step 3, a filling process of the field oxide layer is an HDPCVD process.

12. The method for forming the gate oxide film according to claim 11, wherein after the filling process of the field oxide is completed, the method for forming the gate oxide film further comprises performing a back-etching or a chemical-mechanical polishing to the field oxide layer to achieve none of the field oxide layer left outside the shallow trenches.

13. The method for forming the gate oxide film according to claim 1, wherein after step 4, the method for forming the gate oxide film further comprises steps of:

forming a gate conducting material layer; and patterning the gate conducting material layer in a forming area of gate structures, wherein the gate oxide film and the gate conducting material layer are stacked.

14. The method for forming the gate oxide film according to claim 13, wherein the gate conducting material layer comprises polysilicon.

15. The method for forming the gate oxide film according to claim 1, wherein semiconductor devices that include the gate oxide film comprise CMOS, VDMOS and IGBT.

* * * * *